(12) United States Patent
Della Torre et al.

(10) Patent No.: US 6,658,065 B1
(45) Date of Patent: Dec. 2, 2003

(54) SYSTEM OF AND METHOD FOR REDUCING OR ELIMINATING THE UNWANTED SIDEBAND IN THE OUTPUT OF A TRANSMITTER COMPRISING A QUADRATURE MODULATOR FOLLOWED BY A TRANSLATIONAL LOOP

(75) Inventors: Valentina Della Torre, Irvine, CA (US); Frederic M. Stubbe, Irvine, CA (US); Kashif A. Ahmed, Irvine, CA (US); Ricke W. Clark, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/514,501

(22) Filed: Feb. 29, 2000

(51) Int. Cl.[7] .................................................. H04K 1/02
(52) U.S. Cl. ....................................... 375/296; 375/327
(58) Field of Search ................................ 375/298, 307, 375/308, 376, 261, 280, 272, 273; 455/91, 109, 126, 85, 42, 47, 63, 67.3, 86; 332/103, 144, 149

(56) References Cited

U.S. PATENT DOCUMENTS 5,128,968 A  *  7/1992  Yoshida ........................ 375/344
5,771,263 A  *  6/1998  Kanazawa et al. ........... 375/261
6,028,493 A  *  2/2000  Olgaard et al. ............... 332/103
6,208,875 B1 *  3/2001  Damgaard et al. ........... 455/552
6,215,362 B1 *  4/2001  Feng et al. ..................... 331/17
6,278,391 B1 *  8/2001  Walker .......................... 341/118
6,298,096 B1 * 10/2001  Burgin .......................... 375/296
6,347,121 B1 *  2/2002  Sointula ........................ 375/259
6,516,184 B1 *  2/2003  Damgaard et al. ............ 455/86
6,526,265 B1 *  2/2003  Damgaard et al. ........... 455/118

OTHER PUBLICATIONS

Moffat, Mark, et al., *An ISM band Transceiver Chip for Digital Spread Spectrum Communication*, GEC Plessey Semiconductors, Inc., Scotts Valley, CA 95067, USA.

* cited by examiner

Primary Examiner—Emmanuel Bayard
(74) Attorney, Agent, or Firm—Mintz Levin Cohn Ferris Clovsky & Popeo, P.C.

(57) ABSTRACT

A system of and method for reducing or eliminating any unwanted sideband component in the output of a transmitter comprising a quadrature modulator followed by a translational loop. In one implementation, a value representative of the unwanted sideband is derived from a low frequency signal generated within or by the translational loop. In this implementation, the low frequency signal is taken from an input to a VCO within the translational loop.

16 Claims, 17 Drawing Sheets

SYSTEM OF AND METHOD FOR REDUCING OR ELIMINATING THE UNWANTED SIDEBAND IN THE OUTPUT OF A TRANSMITTER COMPRISING A QUADRATURE MODULATOR FOLLOWED BY A TRANSLATIONAL LOOP

BACKGROUND OF THE INVENTION

1. Field of the Invention

This invention relates generally to quadrature modulators, and, more specifically, to reducing or eliminating the unwanted sideband in the output of a transmitter comprising a quadrature modulator followed by a translational loop.

2. Related Applications

This application is related to U.S. patent application Ser. No. 09/515,633, entitled "SYSTEM OF AND METHOD FOR REDUCING OR ELIMINATING THE UNWANTED SIDEBAND IN A SIGNAL DERIVED FROM THE OUTPUT OF A QUADRATURE MODULATOR," and U.S. patent application Ser. No. 09/515,538, entitled "SYSTEM OF AND METHOD FOR COMPENSATING A BASEBAND SIGNAL TO REDUCE THIRD ORDER MODULATION DISTORTION," both of which are filed on even date herewith, both of which are owned in common by the assignee hereof, and both of which are hereby fully incorporated by reference herein as though set forth in full.

BACKGROUND

In a quadrature modulator, identified with numeral 30 in FIG. 1A, a complex baseband signal, i.e., a baseband signal having I and Q components, BBI and BBQ, assumed to be in quadrature (out of phase by 90°), is mixed with a complex local oscillator signal, also having I and Q components, LOI1 and LOQ1, and also assumed to be in quadrature, to form an output signal. The output signal is typically at an intermediate frequency and may be upconverted to the desired RF transmit frequency through various means such translational loop 120, which upconverts the output of the quadrature modulator by the frequency of a second local oscillator signal, LO2. The frequency of the signal is thus placed at the desired transmit frequency TX, where TX=LO1+LO2.

In the quadrature modulator 30, the I component of the baseband signal, BBI, is mixed, through mixer 31, with the I component of the local oscillator signal, LOI, and the Q component of the baseband signal, BBQ, is mixed, through mixer 32, with the Q component of the local oscillator signal, LOQ. The outputs of mixers 31 and 32 are then combined, through combiner 33, to form the output signal of the quadrature modulator.

If the I and Q components of the baseband signal, and the I and Q components of the local oscillator signal, are perfectly in quadrature, i.e., out of phase by 90° exactly, and the components of the quadrature modulator are perfectly accurate, only the "wanted" sideband will appear at the output of the quadrature modulator, and no energy will appear in the "unwanted" sideband. This follows mathematically as follows: assuming BBI can be represented as A cos ($\omega_{BB}$t+π/2), BBQ as A cos ($\omega_{BB}$t), LOI1 as B cos ($\omega_{LO1}$t+π/2), and LOQ as B cos ($\omega_{LO1}$t), then the output of the quadrature modulator, (BBI×LOI1)+(BBQ×LOQ1), reduces, through known mathematical identities, to A×B cos ([$\omega_{BB}$+$\omega_{LO1}$]t). This is the "wanted" sideband. As can be seen, there is no component at the "unwanted" sideband, i.e., at the frequency $\omega_{LO1}$−$\omega_{BB}$.

However, in the real world, there will be some inaccuracy in the quadrature of the baseband or local oscillator signals or in the components of the quadrature modulator. That will result in some energy at the unwanted sideband frequency. This situation is illustrated in FIG. 2B, which is a frequency domain representation of the output of the quadrature modulator in the case in which there is some inaccuracy in the quadrature of the baseband or local oscillator signals or in the components of the quadrature modulator. Representing baseband as a single frequency, the wanted sideband is identified with numeral 50, while the unwanted sideband is identified with numeral 51. (Representing baseband as a range of frequencies, the wanted sideband is identified with numeral 52, while the unwanted sideband is identified with numeral 53).

Typically, as illustrated, the amplitude of the unwanted sideband is less than that of the wanted sideband. However, in extreme cases, when the quadrature inaccuracy is large, the amplitude of the unwanted sideband can approach that of the wanted sideband.

In the case in which the transmitted signal is a phase-modulated signal, the presence of the unwanted sideband in the output of the quadrature modulator translates into phase error in the transmitted signal. This follows from the fact that the spectrum of the transmitted signal will simply be that of the signal output from the quadrature modulator, but translated upwards in frequency by the frequency of LO2. Thus, the frequency spectrum of the transmitted signal can be represented as shown in FIG. 2C. As can be seen, the spectrum is identical to that shown in FIG. 2B, except that all components thereof have been translated upwards by LO2.

Current GSM standards impose tight limits on the phase error of the transmitted signal. For example, under current GSM standards, the energy of the unwanted sideband should be less than that of the energy of the wanted sideband by 40 dB or more. Such limits are difficult if not impossible to meet with current quadrature modulators.

In "An ISM band Transceiver Chip for Digital Spread Spectrum Communication", ESSCIRC 97, a circuit for generating the LOI and LOQ inputs to a quadrature modulator is described. The circuit is illustrated in FIG. 1B. The LOI and LOQ signals are provided by a divide by two circuit comprising two D-type flip-flops 2 and 3 driven by VCO 1. These signals are input to phase detector 4, which outputs a current proportional to any deviation from quadrature in the LOI and LOQ signals. This current is integrated by integrator 5 to produce an error voltage. The error voltage is input to comparator 6 along with the output from VCO 1. The error voltage is used to modify the mark-space ratio of the VCO output in order to correct for inaccuracies in the VCO and divide by two circuit.

There are several problems with this approach. First, it does not correct for intrinsic errors in the phase detector and comparator (see FIG. 1B).

Second, it does not correct for any inaccuracies in the components of the quadrature modulator (mixers 31 and 32, and combiner 33, in FIG. 1A).

Third, it does not correct for inaccuracies in the quadrature of the baseband signal.

Fourth, it requires a highly accurate phase detector in order to be effective.

Fifth, since it involves both detecting quadrature inaccuracy from and making corrections to the LO signal, a high frequency signal, it is difficult to achieve satisfactory results with this approach.

Accordingly, there is a need for a system for and method of reducing or eliminating the unwanted sideband in the output of a quadrature modulator followed by a translational loop which overcomes the disadvantages of the prior art.

SUMMARY OF THE INVENTION

In accordance with the purpose of the invention as broadly described herein, there is provided a system of and method for reducing or eliminating the unwanted sideband in the output of a transmitter comprising a quadrature modulator followed by a translational loop in which the presence of the unwanted sideband is detected through an unwanted sideband detector coupled to the translational loop. In one embodiment, the system comprises a baseband correction circuit, a quadrature modulator, a translational loop, and an unwanted sideband detector.

The I and Q components of the baseband signal, BBI and BBQ, are input to the baseband correction circuit. The outputs of the baseband correction circuit, BBI' and BBQ', are input to the quadrature modulator as are the I and Q components of the local oscillator signal, LOI1 and LOQ1. The output of the quadrature modulator is input to the translational loop. The signal for transmission is derived from the output of the translational loop. The unwanted sideband detector is coupled to the translational loop. The output of the unwanted sideband detector is input to the baseband correction circuit.

In one implementation, the unwanted sideband detector is coupled to a low frequency signal generated within the translational loop. In one implementation example, the low frequency signal is taken from the input of a VCO within the translational loop.

Any inaccuracy in the quadrature of the baseband or local oscillator signals, or in the components of the quadrature modulator, results in an unwanted sideband in the output of the quadrature modulator and in the output of the translational loop. The unwanted sideband will also be reflected in the low frequency signal input to a VCO within the translational loop, and the implementation example referred to above exploits this property in detecting the presence and magnitude of the unwanted sideband from the signal input to the VCO.

In one embodiment, in a calibration mode of operation, a known baseband signal is applied to the baseband input of the quadrature modulator. The unwanted sideband detector detects the presence of the unwanted sideband, and provides a signal representative thereof to the baseband correction circuit. The baseband correction circuit iteratively revises one or more parameters responsive to the signal provided by the unwanted sideband detector and uses the one or more parameters to iteratively alter the I and Q components of the baseband signal. This process continues until the energy of the unwanted sideband is reduced to an acceptable level. At this point, the value of the one or more parameters is stored in a memory in the baseband correction circuit. Then, in a transmit mode of operation, after a real-world baseband signal is applied to the baseband input thereof, the baseband correction circuit alters one or more of the I and Q components of the real-world baseband signal responsive to the one or more parameters stored in the memory. The result is a corrected baseband signal, which is then modulated up to the transmit frequency by the quadrature modulator in combination with the translational loop. The signal for transmission is then derived from the output of the translational loop. In this mode of operation, the unwanted sideband detector may be deactivated or powered down since it is not used.

In one implementation, the relative phase relationship between BBI and BBQ is progressively adjusted in the calibration mode by the baseband correction circuit until the energy of the unwanted sideband is reduced to an acceptable level. In one implementation example, the baseband correction circuit progressively adjusts a variable relative delay $\phi$ between BBI and BBQ until the energy of the unwanted sideband is at the desired level. At this point, the value of $\phi$ is stored. Later on, during the transmit mode of operation, this value is retrieved and used to set the relative delay between the I and Q components of the baseband signal.

In one embodiment, a method of forming a transmit signal in accordance with the subject invention comprises the steps of retrieving one or more parameters; correcting one or more of the I and Q components, BBI and BBQ, of the baseband signal using the one or more parameters, thereby forming BBI' and BBQ'; quadrature modulating BBI' and BBQ' respectively with the I and Q components of a local oscillator, LOI and LOQ, to form a modulated signal; and deriving the transmit signal from the modulated signal. In one implementation, the deriving step comprises upconverting the modulated signal to form the transmit signal.

In one embodiment, a method of calibrating a transmitter comprises correcting a baseband signal using one or more parameters; quadrature modulating the corrected baseband signal; detecting an unwanted sideband from a signal derived from the modulated signal; determining whether the unwanted sideband is below a desired threshold level; if so, storing the one or more parameters and ending the process; if not, revising the one or more parameters responsive to the detected unwanted sideband, and looping back to the correcting step, whereupon the foregoing process may be repeated one or more times. In one implementation, the foregoing process iterates one or more times until the unwanted sideband component is reduced to an acceptable level.

In one implementation example, the modulated signal is upconverted to a desired transmission frequency through a translational loop, and the detecting step comprises detecting the unwanted sideband from a low frequency signal generated within the translational loop. In one configuration, the low frequency signal is generated at the input of a VCO within the translational loop.

One advantage of the invention is the ability to correct for any inaccuracies in the components of the quadrature modulator.

Another advantage is the ability to correct for any inaccuracies in the quadrature of the I and Q components of the baseband signal.

A third advantage is that a highly accurate phase detector is not required.

A fourth advantage is that correction to a high frequency signal is not required. Instead, the invention only requires correction to the relatively low frequency baseband signal.

A fifth advantage is detection of unwanted sideband from a high frequency signal is not required. Instead, any unwanted sideband component is detected from a low frequency signal generated within the translation loop of the transmitter.

Additional advantages of the subject invention will be set forth in the description which follows, or will be apparent to one of skill in the art.

DETAILED DESCRIPTION OF THE PREFERRED EMBODIMENTS

I. Example Environment

Figure 1A:
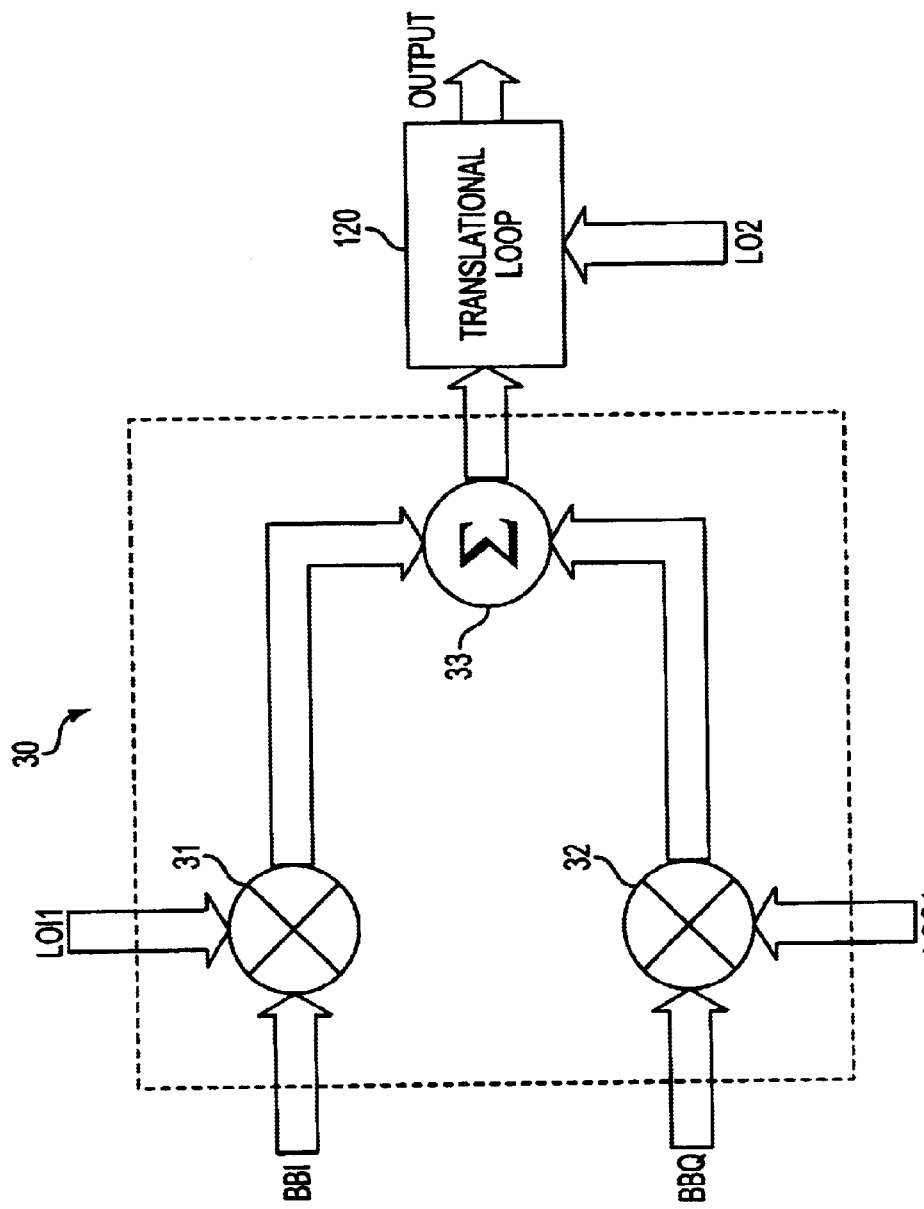
FIG. 1A illustrates a transmitter comprising a quadrature modulator followed by a translational loop.
Figure 1B:
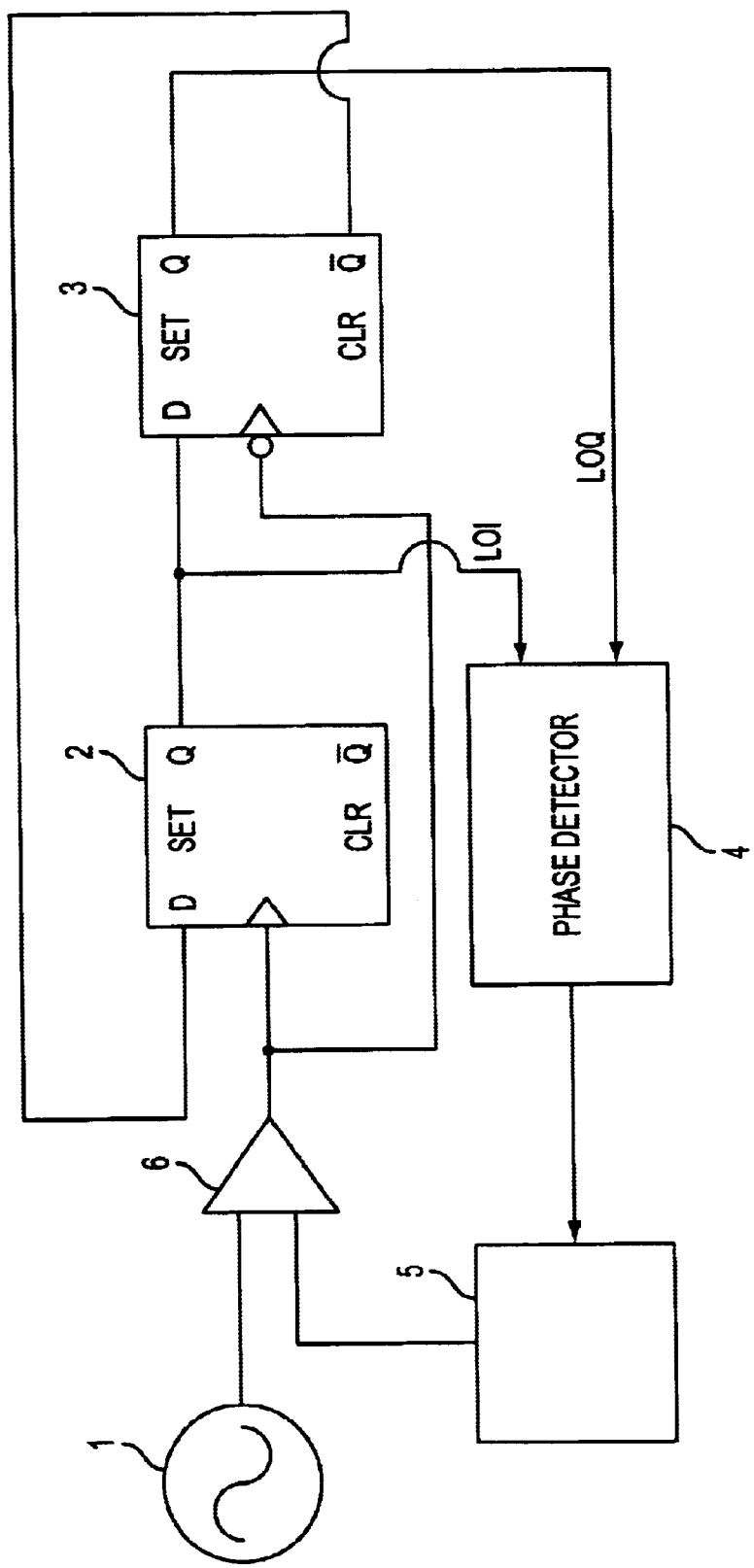
FIG. 1B illustrates a conventional circuit for generating the I and Q components of a complex LO signal.

Wireless communication systems are an integral component of the ongoing technology revolution. Mobile radio communication systems, such as cellular telephone systems, are evolving at an exponential rate. In a cellular system, a coverage area is divided into a plurality of "cells". A cell is the coverage area of a base station or transmitter. Low power transmitters are utilized, so that frequencies used in one cell can also be used in cells that are sufficiently distant to avoid interference. Hence, a cellular telephone user, whether mired in traffic gridlock or attending a meeting, can transmit and receive phone calls so long as the user is within a "cell" served by a base station.

Mobile cellular systems were originally developed as analog systems. After their introduction for commercial use in the early 1980s, mobile cellular systems began to experience rapid and uncoordinated growth. In Europe, for example, individual countries developed their own systems. Generally, the systems of individual countries were incompatible, which constricted mobile communications within national boundaries and restricted the market for mobile equipment developed for a particular country's system.

In 1982, in order to address this growing problem, the Conference of European Posts and Telecommunications (CEPT) formed the Groupe Speciale Mobile (GSM) to study and develop a set of common standards for a future pan-European cellular network. It was recommended that two blocks of frequencies in the 900 MHz range be set aside for the system.

The initial goals for the new system included international roaming ability, good subjective voice quality, compatibility with other systems such as the Integrated Services Digital Network (ISDN), spectral efficiency, low handset and base station costs, and the ability to support new services and a high volume of users.

One of the initial, major decisions in the development of the GSM standard was adoption of a digital, rather than an analog, system. As mentioned above, analog systems were experiencing rapid growth and the increasing demand was straining the capacity of the available frequency bands. Digital systems offer improved spectral efficiency and are more cost efficient. The quality of digital transmission is also superior to that of analog transmission. Background sounds such as hissing and static and degrading effects such as fadeout and cross talk are largely eliminated in digital systems. Security features such as encryption are more easily implemented in a digital system. Compatibility with the ISDN is more easily achieved with a digital system. Finally, a digital approach permits the use of Very Large Scale Integration (VLSI), thereby facilitating the development of cheaper and smaller mobile handsets.

In 1989, the European Telecommunications Standards Institute (ETSI) took over responsibility for the GSM standards. In 1990, phase I of the standard was published and the first commercial services employing the GSM standard were launched in 1991. It was also renamed in 1991 as the Global System for Mobile Communications (still GSM). After its early introduction in Europe, the standard was elevated to a global stage in 1992 when introduced in Australia. Since then, GSM has become the most widely adopted and fastest growing digital cellular standard, and is positioned to become the world's dominant cellular standard. With (currently) 324 GSM networks in operation in 129 countries, GSM provides almost complete global coverage. As of January 1999, according to the GSM Memorandum of Understanding Association, GSM accounted for more than 120 million subscribers. Market research firms estimate that by 2001, there will be more than 250 million GSM subscribers worldwide. At that time, GSM will account for almost 60% of the global cellular subscriber base, with yearly shipments exceeding 100 million phones.

Figure 6A:
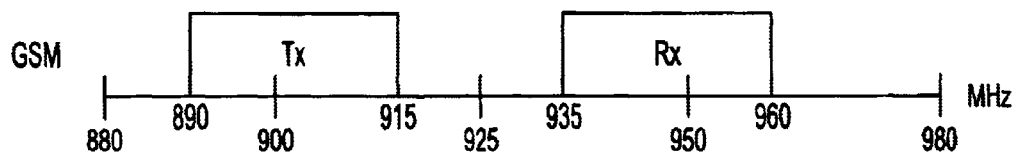
FIG. 6A illustrates the transmit and receive frequency bands under the GSM standard.
Figure 6B:
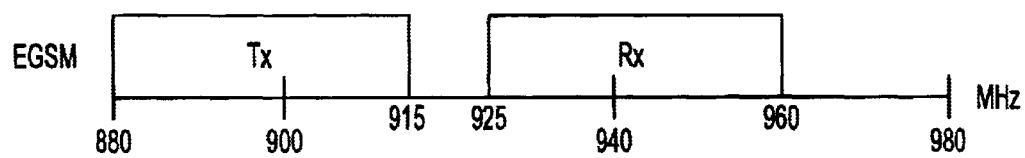
FIG. 6B illustrates the transmit and receive frequency bands under the EGSM standard.

Two frequency bands of 25 MHz were allocated for GSM use. As illustrated in FIG. 6a, the 890–915 MHz band is reserved for transmission or "uplink" (mobile station to base station), and the 935–960 MHz band is reserved for reception or "downlink" (base station to mobile station). An extra ten MHz of bandwidth was later added to each frequency band. The standard incorporating this extra bandwidth (two 35 MHz bands) is known as Extended GSM (EGSM). In EGSM, the transmission band covers 880–915 MHz and the receiving band covers 925–960 MHz (FIG. 6b). The terms GSM and EGSM are used interchangeably, with GSM sometimes used in reference to the extended bandwidth portions (880–890 MHz and 925–935 MHz). Sometimes, the originally specified 890–915 MHz and 935–960 MHz bands are designated Primary GSM (PGSM). In the following description, GSM will be used in reference to the extended bandwidth (35 MHz) standard.

Figure 6C:
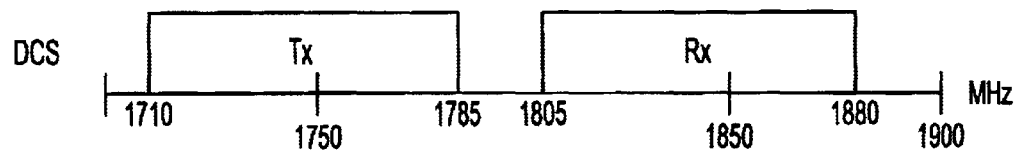
FIG. 6C illustrates the transmit and receive frequency bands under the GSM 1800 or DCS standards.
Figure 6D:
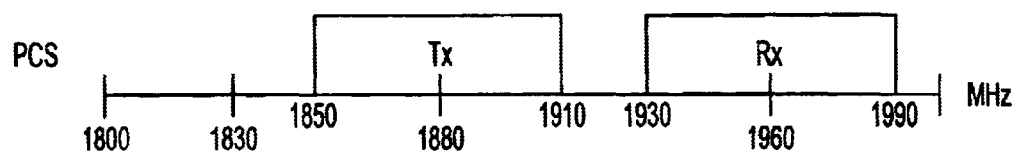
FIG. 6D illustrates the transmit and receive frequency bands under the GSM 1900 or PCS standards.

Due to the expected widespread use of GSM, capacity problems in the 900 MHz frequency bands were anticipated and addressed. ETSI had already defined an 1800 MHz variant (DCS or GSM 1800) in the first release of the GSM standard in 1989. In DCS, the transmission band covers 1710–1785 MHz and the receiving band covers 1805–1880 MHz (FIG. 6c). In the United States, the Federal Communications Commission (FCC) auctioned large blocks of spectrum in the 1900 MHz band, aiming to introduce digital wireless networks to the country in the form of a mass market Personal Communication Service (PCS). The GSM service in the US is known as PCS or GSM 1900. In PCS, the transmission band covers 1850–1910 MHz and the receiving band covers 1930–1990 MHz (FIG. 6d).

Regardless of which GSM standard is used, once a mobile station is assigned a channel, a fixed frequency relation is maintained between the transmit and receive frequency bands. In GSM (900 MHz), this fixed frequency relation is 45 MHz. If, for example, a mobile station is assigned a transmit channel at 895.2 MHz, its receive channel will always be at 940.2 MHz. This also holds true for DCS and PCS; the frequency relation is just different. In DCS, the receive channel is always 95 MHz higher than the transmit channel and, in PCS, the receive channel is 80 MHz higher than the transmit channel. This frequency differential will be referred to in the ensuing discussion as the frequency offset.

Figure 7:
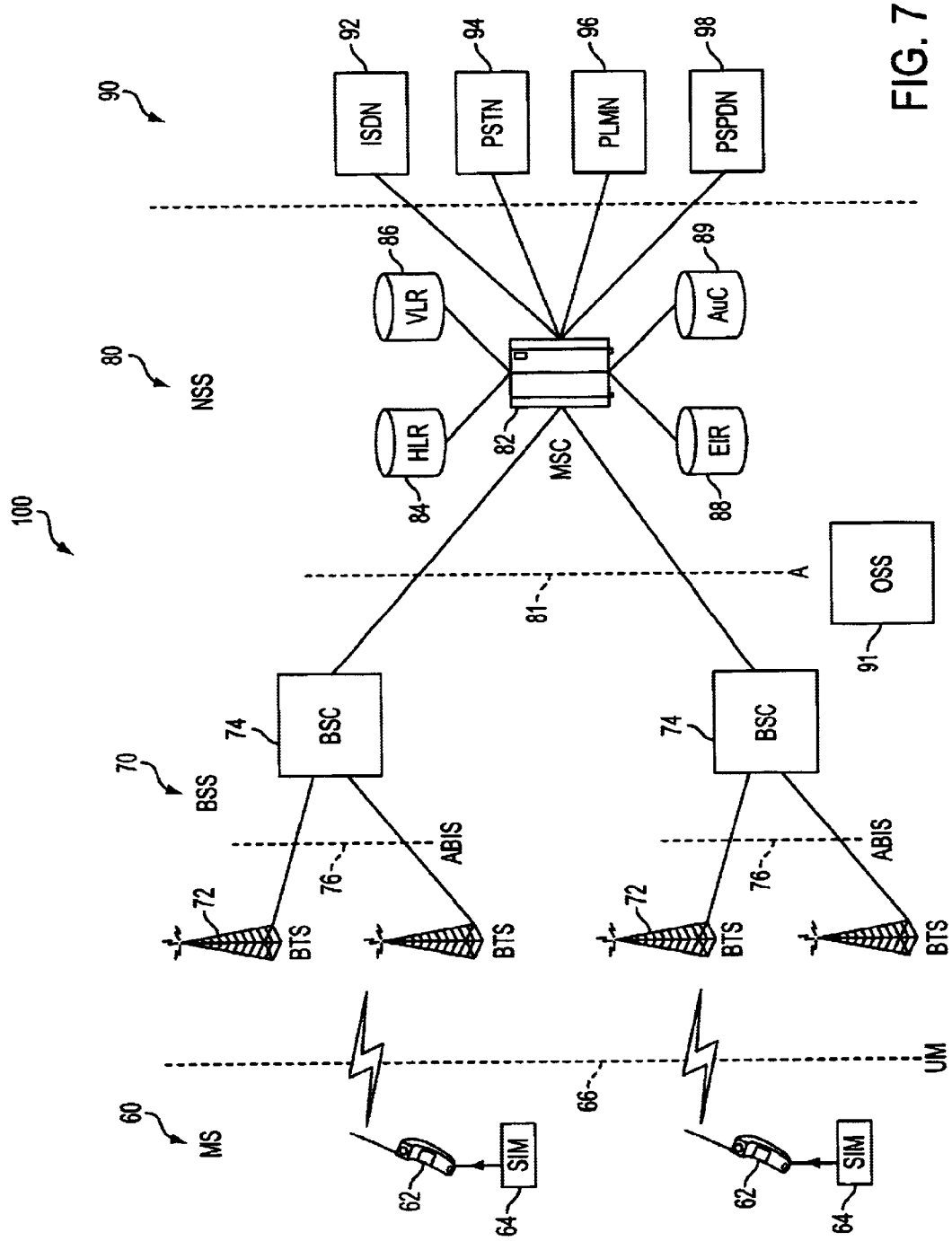
FIG. 7 is a block diagram of an exemplary GSM network.

The architecture of one implementation of a GSM network 100 is depicted in block form in FIG. 7. GSM network 100 is divided into four interconnected components or subsystems: a Mobile Station (MS) 60, a Base Station Subsystem (BSS) 70, a Network Switching Subsystem (NSS) 80 and an Operation Support Subsystem (OSS) 91. Generally, MS 60 is the mobile equipment or phone carried by the user; BSS 70 interfaces with multiple MSs 60 and manages the radio transmission paths between the MSs and NSS 80; NSS 80 manages system switching functions and facilitates communications with other networks such as the PSTN and the ISDN; and OSS 91 facilitates operation and maintenance of the GSM network.

Mobile Station 60 comprises Mobile Equipment (ME) 62 and Subscriber Identity Module (SIM) 64. ME 62 is typically a digital mobile phone or handset. SIM 64 is a memory device that stores subscriber and handset identification information. It is implemented as a smart card or as a plug-in module and activates service from any GSM phone. Among the information stored on SIM 64 are a unique International Mobile Subscriber Identity (IMSI) that identifies the subscriber to system 100, and an International Mobile Equipment Identity (IMEI) that uniquely identifies the mobile equipment. A user can access the GSM network via any GSM handset or terminal through use of the SIM. Other information, such as a personal identification number (PIN) and billing information, may be stored on SIM 64.

MS 60 communicates with BSS 70 across a standardized "Um" or radio air interface 66. BSS 70 comprises multiple base transceiver stations (BTS) 72 and base station controllers (BSC) 74. A BTS is usually in the center of a cell and consists of one or more radio transceivers with an antenna. It establishes radio links and handles radio communications over the Um interface with mobile stations within the cell. The transmitting power of the BTS defines the size of the cell. Each BSC 74 manages multiple, as many as hundreds of, BTSs 72. BTS-BSC communication is over a standardized "Abis" interface 76, which is specified by GSM to be standardized for all manufacturers. The BSC allocates and manages radio channels and controls handovers of calls between its BTSs.

The BSCs of BSS 70 communicate with network subsystem 80 over a GSM standardized "A" interface 81. The A interface uses an SS7 protocol and allows use of base stations and switching equipment made by different manufacturers. Mobile Switching Center (MSC) 82 is the primary component of NSS 80. MSC 82 manages communications between mobile subscribers and between mobile subscribers and public networks 90. Examples of public networks 90 that MSC 82 may interface with include Integrated Services Digital Network (ISDN) 92, Public Switched Telephone Network (PSTN) 94, Public Land Mobile Network (PLMN) 96 and Packet Switched Public Data Network (PSPDN) 98.

MSC 82 interfaces with four databases to manage communication and switching functions. Home Location Register (HLR) 84 contains details on each subscriber residing within the area served by the MSC, including subscriber identities, services to which they have access, and their current location within the network. Visitor Location Register (VLR) 86 temporarily stores data about roaming subscribers within a coverage area of a particular MSC. Equipment Identity Register (EIR) 88 contains a list of mobile equipment, each of which is identified by an IMEI, which is valid and authorized to use the network. Equipment that has been reported as lost or stolen is stored on a separate list of invalid equipment that allows identification of subscribers attempting to use such equipment. The Authorization Center (AuC) 89 stores authentication and encyrption data and parameters that verify a subscriber's identity.

OSS 91 contains one or several Operation Maintenance Centers (OMC) that monitor and maintain the performance of all components of the GSM network. OSS 91 maintains all hardware and network operations, manages charging and billing operations and manages all mobile equipment within the system.

Figure 8:
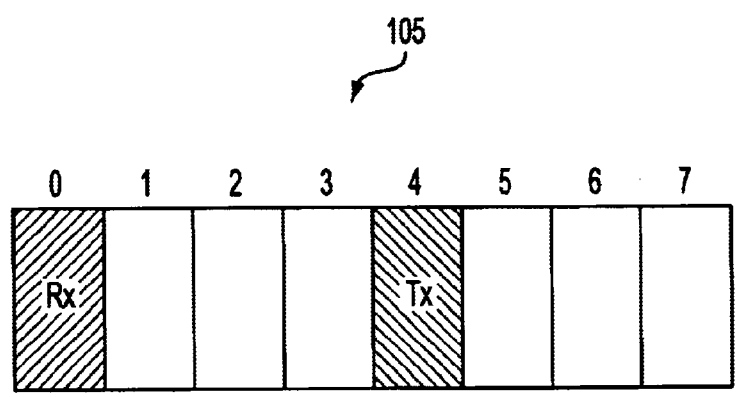
FIG. 8 illustrates the format of a conventional TDMA frame.

The GSM transmitting and receiving bands are divided into 200 kHz carrier frequency bands. Using Time Division Multiple Access techniques (TDMA), each of the carrier frequencies is subdivided in time into eight time slots. Each time slot has a duration of approximately 0.577 ms, and eight time slots form a TDMA "frame", having a duration of 4.615 ms. One implementation of a conventional TDMA frame 80 having eight time slots 0–7 is illustrated in FIG. 8.

In this conventional TDMA framework, each mobile station is assigned one time slot for receiving data and one time slot for transmitting data. In TDMA frame 105, for example, time slot zero has been assigned to receive data and time slot four has been assigned to transmit data. The receive slot is also referred togas the downlink slot and the transmit slot is referred to as the uplink slot. After the eight slots, the remaining slots are used for offset, control, monitoring and other operations. This framework permits concurrent reception by as many as eight mobile stations on one frequency and concurrent transmission by as many as eight mobile stations on one frequency.

As described above, there are currently three GSM frequency bands defined with the proliferation of wireless handset usage not showing signs of slowing down, it is likely that additional bands will be defined in the future. Hence, GSM mobile stations intended for global usage should have multi-band capability.

Figure 9:
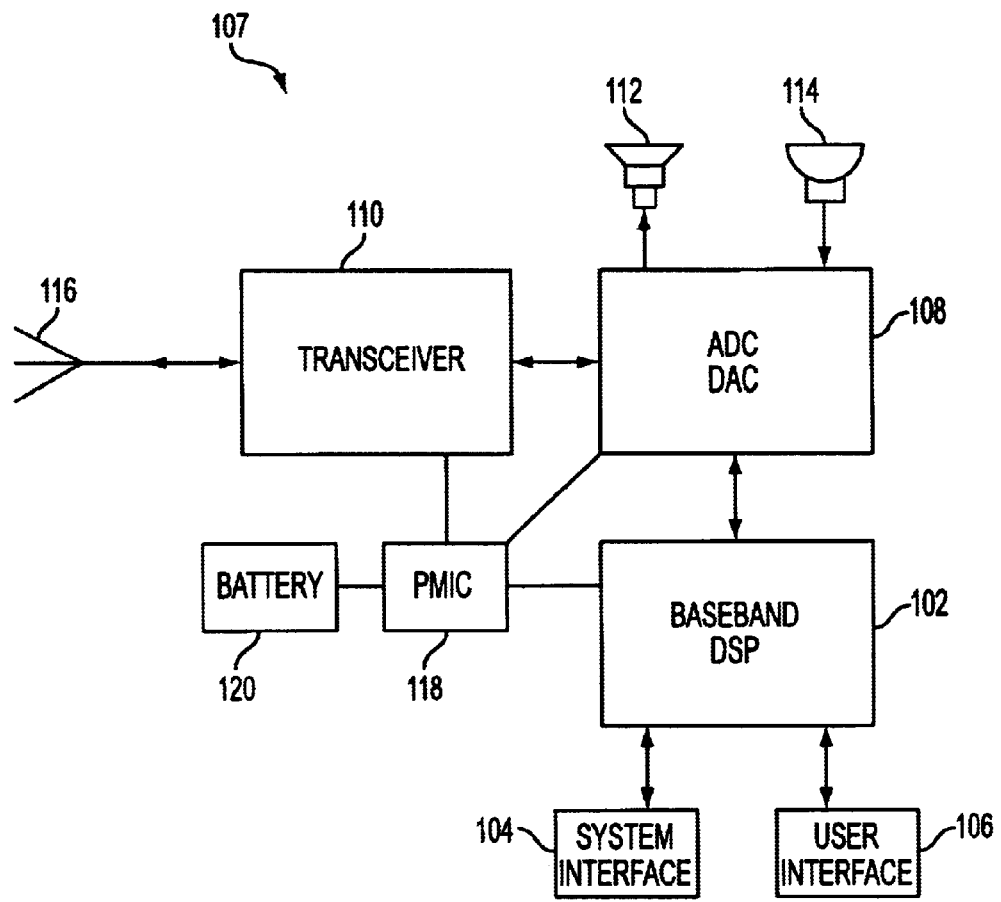
FIG. 9 illustrates a block diagram of a handset or mobile station.

FIG. 9 is a block diagram of one implementation of a mobile, wireless handset 107. Handset 107 may operate as a mobile station within a GSM network, such as a mobile station 62 within a GSM network 100 as illustrated in FIG. 7. Handset 107 includes a baseband digital signal processor (DSP) 102, typically integrated on a single die. Baseband DSP 102 directs the overall operation of mobile station 107. It processes baseband data received from antenna 116 and transceiver 110 into an audible acoustic signal for announcement over speaker 112. DSP 102 also processes acoustic data received from microphone 114 into baseband data which is provided to transceiver 110 for transmission over antenna 116.

DSP 102 also manages system and user interface tasks via a system interface 104 and a user interface 106. System interface 104 may include suitable means for managing functions such as GSM network and modem access and subscriber services. User interface 106 may include suitable means for inputting and displaying information, such as a keypad, display, backlight, volume control and real time clock. In one implementation, DSP 102 is housed in a 128-pin TQFP and, in another implementation, DSP 102 is housed in a 160-pin 12×12 mm Chip Array Ball Grid Array (CABGA).

In one implementation, baseband DSP 102 interfaces with transceiver 110, speaker 112 and microphone 114 via integrated analog IC 108. IC 108 implements an analog-to-digital converter (ADC), a digital-to-analog converter (DAC) and all signal conversions required to permit interface between DSP 102 and transceiver 110, speaker 112 and microphone 114. Typically, the ADC and DAC will be embodied in a CODEC. Microphone 114 is configured to convert acoustic signals, typically those in the audio band, into analog electric signals. The signals captured by microphone 114 are decoded and digitized by the ADC in IC 108 and processed into baseband I and Q signals by DSP 102. The digital baseband I and Q signals are converted into an analog signal stream by the DAC in IC 108, and are then modulated and transmitted (via antenna 116) by transceiver 110. Conversely, modulated signals captured by antenna 116 are demodulated and converted into analog baseband I and Q signals by transceiver 110, digitized by IC 108, processed by DSP 102, and converted into an analog acoustic signal by IC 108 that is announced by speaker 112.

IC 108 may be implemented in a 100-pin TQFP, a 100-pin 10×10 mm CABGA package or in any other suitable housing. A power management IC (PMIC) 118 is coupled to a battery 120 and integrates on a single die all power supply related functions required by handset 107.

Handset 107 may include band selection means (not shown), such as a menu selection or switch, to permit a user to select one of a plurality of possible bands. Alternatively, or in addition, the band selection means may permit automatic selection of the appropriate band, based on a signal from a base station indicating the proper band.

Also included in the handset 107 is a channel selection means (not shown) for selection of the appropriate channel within the selected band responsive to suitable signals from the base station handling the handset at a time. For the GSM, DCS, and PCS bands, the channel is a 200 kHz slot within the selected band. The channel selection means permits selection of either or both of the transmit and receive channels. In one implementation, selection of the transmit channel implies selection of the receive channel, and selection of the receive channel implies selection of the transmit channel, since the two bear a predetermined relationship to one another. For example, for the GSM band, the receive channel is 45 MHz higher than the transmit channel; for the DCS band, the receive channel is 95 MHz higher than the transmit channel; and for the PCS band, the receive channel is 80 MHz higher than the transmit channel. In this implementation, express selection of both the transmit and receive channels is unnecessary.

The handset 107 may be configured to permit full duplex transmission, that is, concurrent transmission and reception over respectively the transmit and receive channels.

II. Preferred Embodiments

Several embodiments of the subject invention are illustrated in FIGS. 2A, 2D–2G. In these figures, like elements are referenced with like identifying numerals.

Figure 2A:
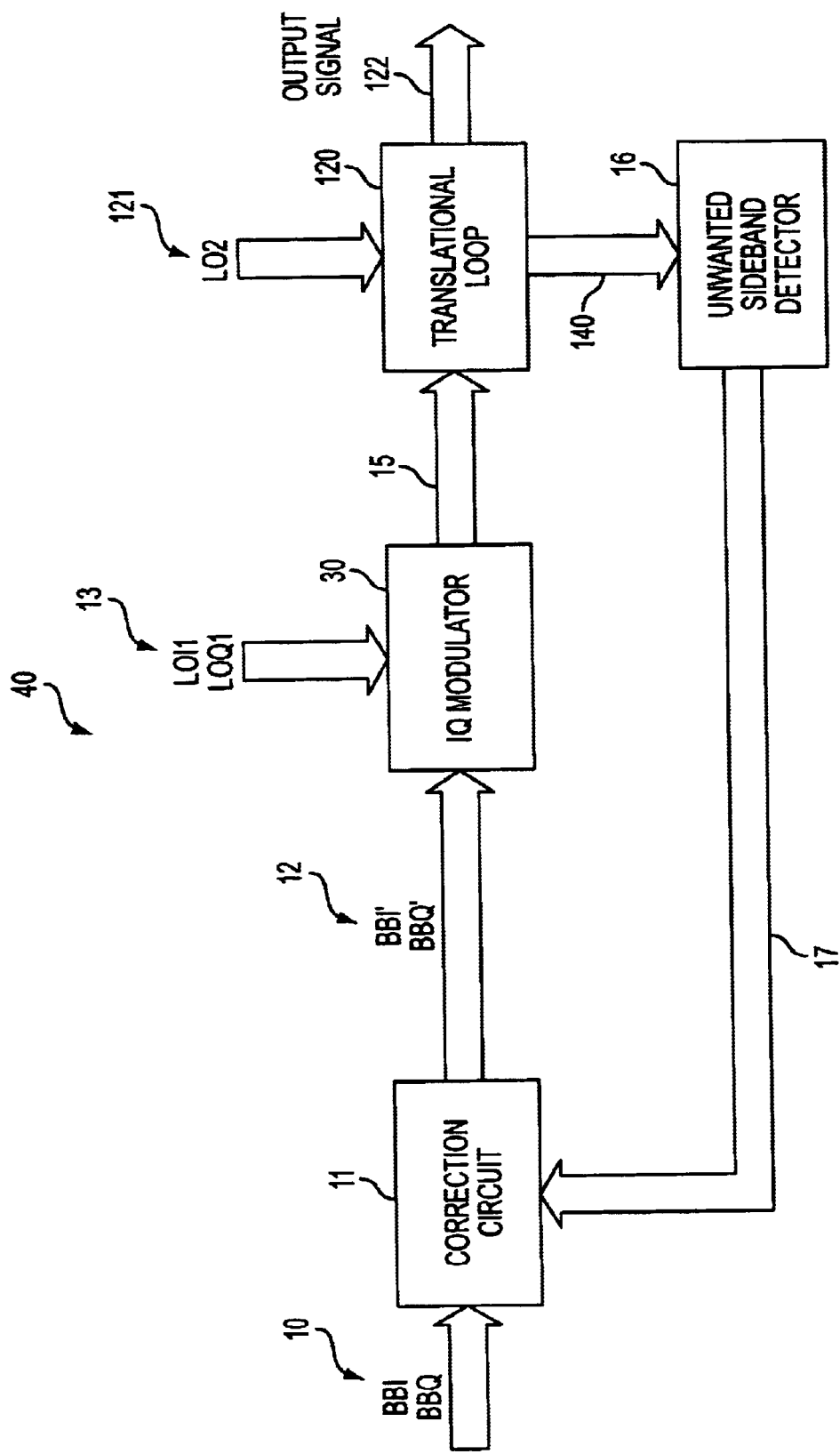
FIG. 2A illustrates a first embodiment of a system in accordance with the subject invention.
Figure 2B:
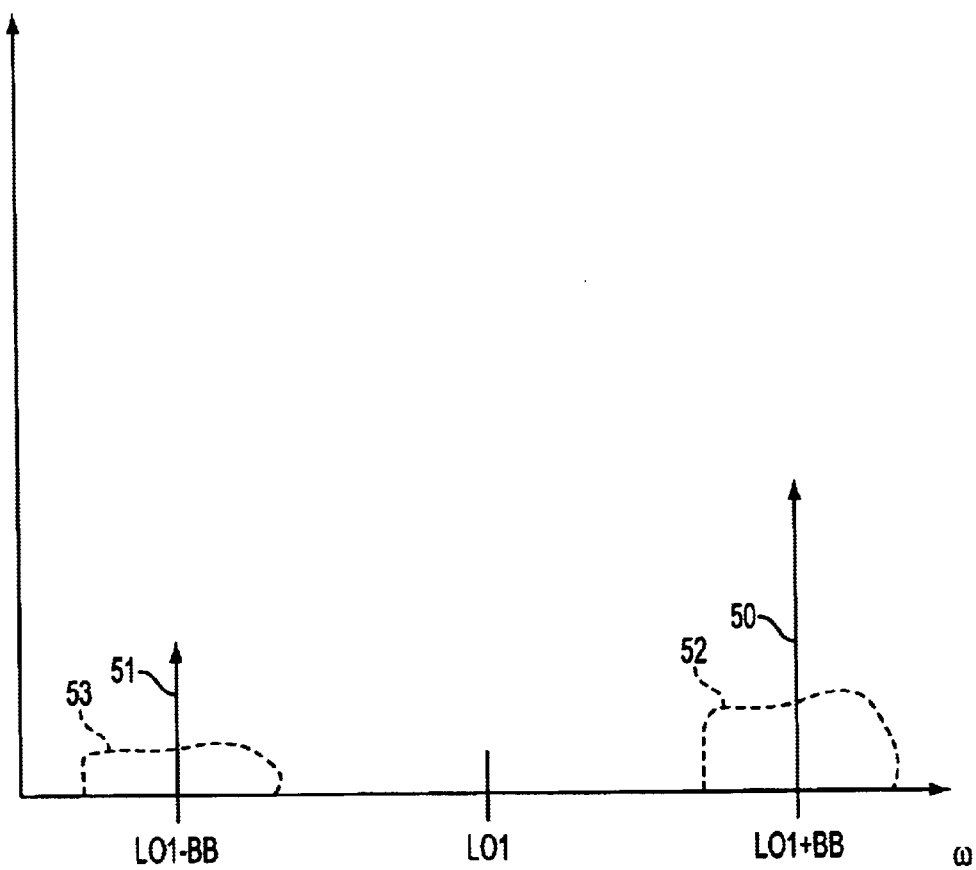
FIG. 2B is a frequency domain representation of the wanted and unwanted sideband components in the output of a quadrature modulator.
Figure 2C:
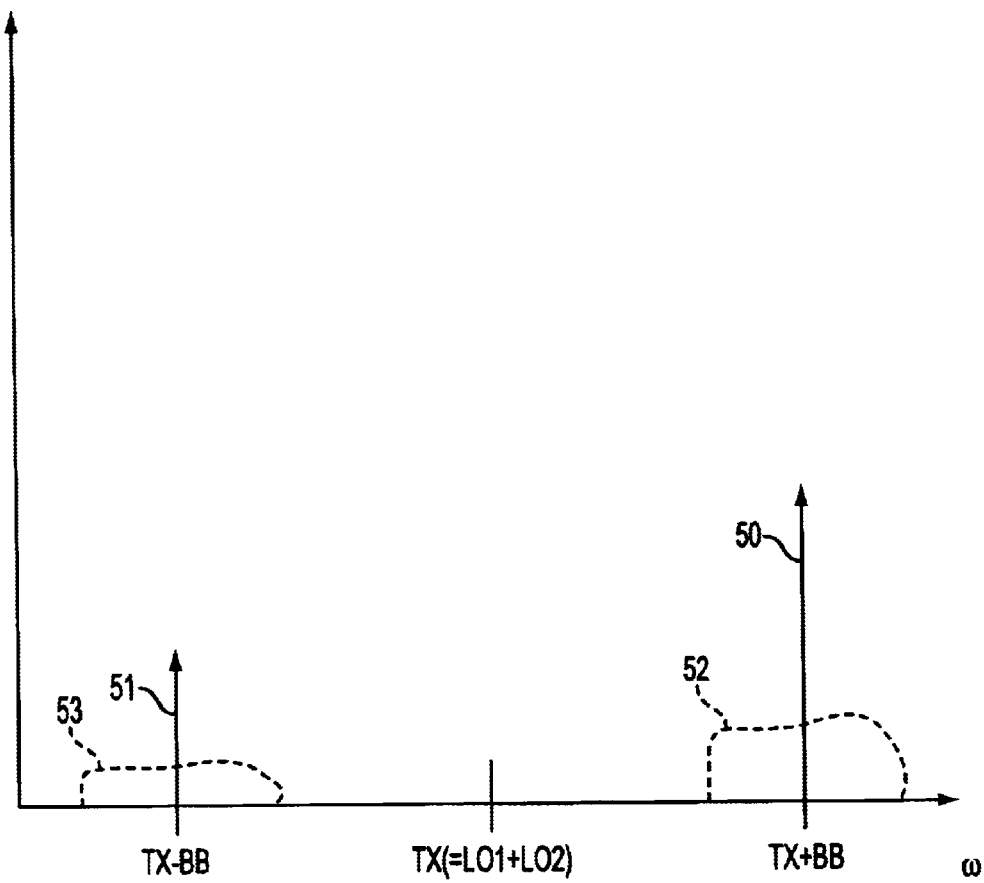
FIG. 2C is a frequency domain representation of the wanted and unwanted sideband components in the output of translational loop following a quadrature modulator.

A first embodiment of a system 40 in accordance with the subject invention is illustrated in FIG. 2A. The system may be part of a transmitter configured for use in a wireless communication system of the type described in the previous section.

With reference to FIG. 2A, the system 40 comprises a baseband correction circuit 10, a quadrature modulator 13, a translational loop 120, and an unwanted sideband detector 16.

The I and Q components of the baseband signal, BBI and BBQ, identified with numeral 10, are input to the baseband correction circuit 11. The outputs of the baseband correction circuit, BBI' and BBQ', identified with numeral 12, are input to the quadrature modulator 30. Also input to the quadrature modulator 30 are the I and Q components of a first local oscillator signal, LOI1 and LOQ1, identified with numeral 13. The output of the quadrature modulator, identified with numeral 15, is input to the translational loop 120. A signal for transmission is derived from the output of the translational loop, identified with numeral 122.

The unwanted sideband detector 16 is coupled to the translational loop 120. The unwanted sideband detector forms a signal representative of any unwanted sideband component in the signal output from the translational loop. This signal, which is identified with numeral 17, is input to the baseband correction circuit 11.

In operation, the baseband correction circuit 11 sets or adjusts, responsive to the signal 17 representative of any unwanted sideband component of the output 122 of translational loop 120, one or more parameters, and then uses the one or more parameters to correct one or more of BBI and BBQ. The one or more parameters are set or adjusted to eliminate or reduce to an acceptable level the energy of the unwanted sideband component. The result of this process is BBI' and BBQ'.

The quadrature modulator 30 quadrature modulates BBI' and BBQ' using the complex first oscillator signal LOI1 and LOQ1 to form modulated signal 15.

Translational loop 120 upconverts the signal 15 to the desired transmission frequency using a second local oscillator signal LO2.

Any inaccuracy in the quadrature of the baseband or first local oscillator signals, or in the components of the quadrature modulator, results in an unwanted sideband in the output of the quadrature modulator 30. As previously discussed, any unwanted sideband in the output of the quadrature modulator 30 will also appear in the output of the translational loop 120.

Unwanted sideband detector 16 receives a signal 140 from the translational loop 120, and, responsive thereto, forms the signal 17 representative of any unwanted sideband in the output signals 15 or 122. In one implementation, the signal 140 is a low frequency signal generated within the translational loop 120.

In one implementation, correction circuit 11 iteratively adjusts the one or more parameters, and iteratively adjusts the one or more of the components of the baseband signal 10, while monitoring the signal 17, until the unwanted sideband is reduced to an acceptable level. In one configuration, this process occurs during a calibration mode of operation of the transmitter.

Figure 2D:
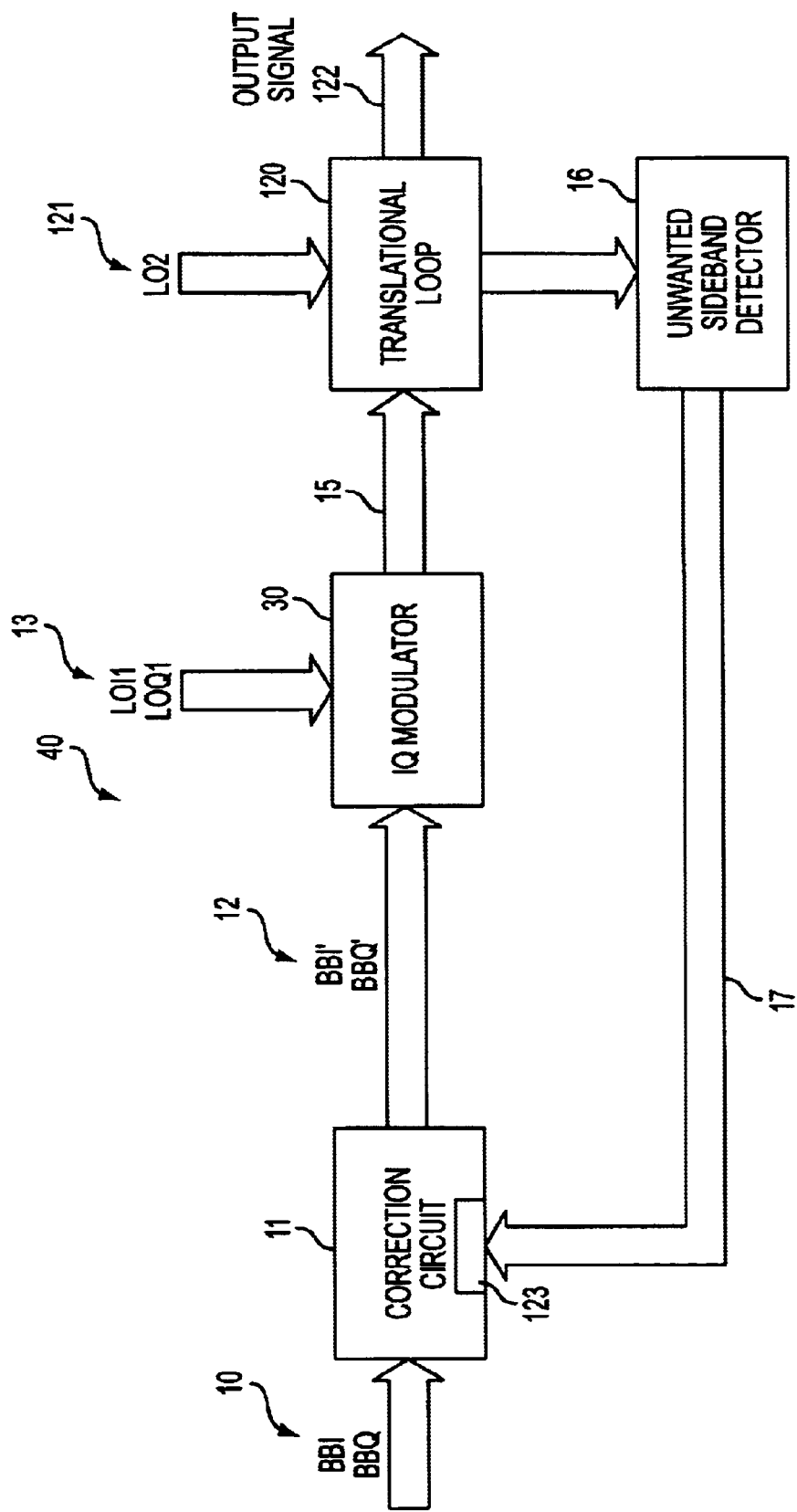
FIG. 2D illustrates a second embodiment of a system in accordance with the subject invention.

In one embodiment, illustrated in FIG. 2D, a calibration mode of operation is supported in which a known baseband signal is applied to the baseband input of the quadrature modulator 30. The unwanted sideband detector 16 detects the presence of an unwanted sideband in the output 122 of translational loop 120, and provides a signal 17 representative thereof to the baseband correction circuit 11. The baseband correction circuit 11 iteratively alters one or parameters, and uses the one or more parameters to correct one or more of the I and Q components of the baseband signal responsive to and while monitoring the signal provided by the unwanted sideband detector until the energy of the unwanted sideband is reduced to an acceptable level. At this point, the values of the one or more parameters are stored in a memory 123 in the baseband correction circuit 11.

Then, in a transmit mode of operation, a real-world baseband signal is applied to the baseband input of the baseband correction circuit 11. That circuit then retrieves the values of the one or more parameters stored in the memory 123, and corrects the one or more of the I and Q components of the real-world baseband signal using these values. The result is a corrected baseband signal 12. The corrected baseband signal 12 is then upconverted to the desired transmission frequency by the quadrature modulator 30 in combination with the translational loop 120.

In one implementation, the relative phase relationship between BBI and BBQ is iteratively adjusted in the calibration mode of operation until the energy of the unwanted sideband is reduced to an acceptable level. In one implementation example, the baseband correction circuit iteratively adjusts a delay $\phi$ added to one or the other of BBI and BBQ until the energy of the unwanted sideband is at the desired level. When this has occurred, the value of $\phi$ is stored. Later on, during the transmit mode of operation, this value is retrieved and used to delay one or the other of the I and Q components of the baseband signal.

Figure 2E:
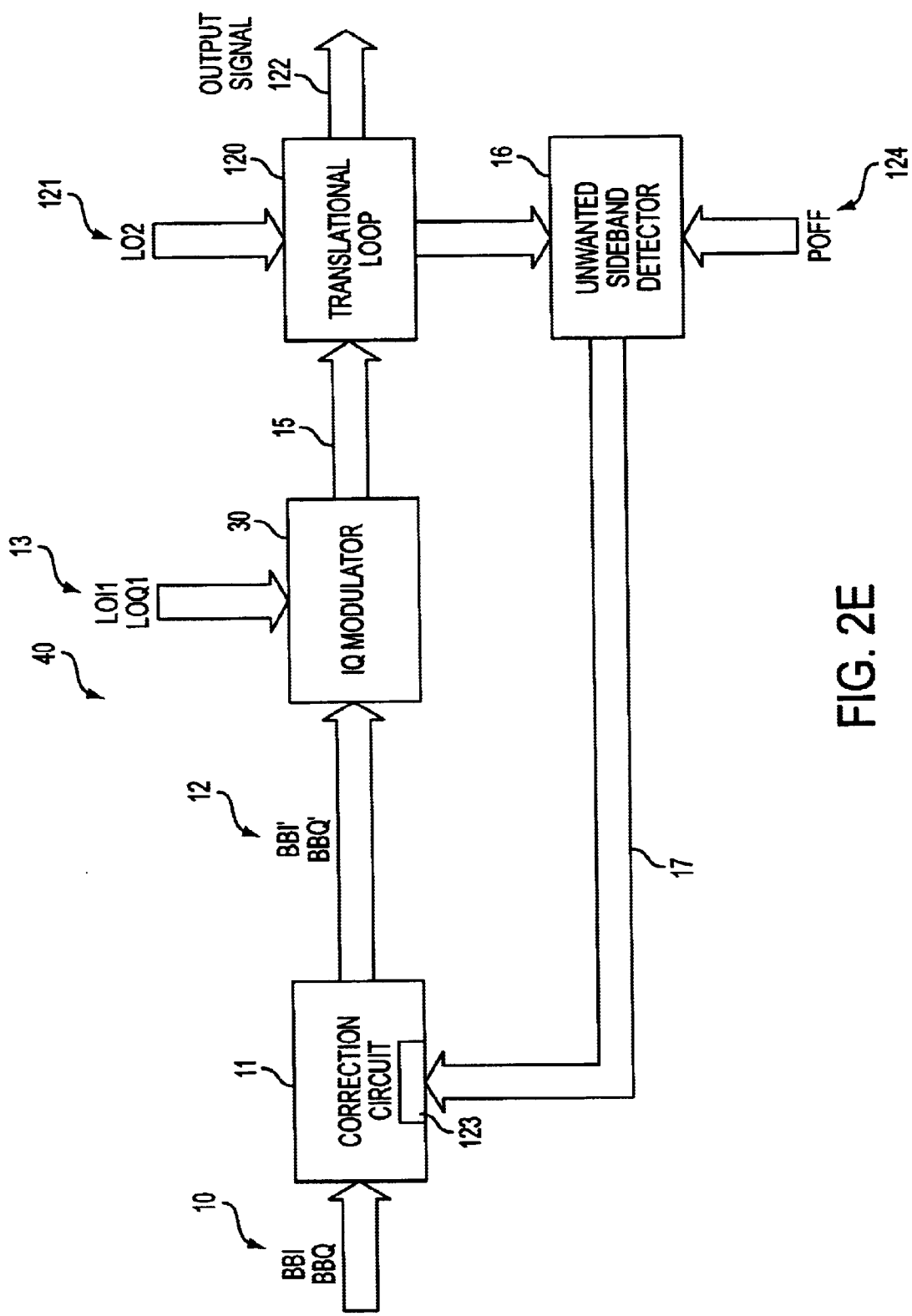
FIG. 2E illustrates a third embodiment of a system in accordance with the subject invention.

In one embodiment, illustrated in FIG. 2E, the unwanted sideband detector 16 may be deactivated or powered down, in whole or in part, in the transmit mode of operation since it is not used. Thus, as illustrated, a signal POFF, identified with numeral 124, is provided as an input to unwanted sideband detector 16. The signal, when asserted, indicates that the system is in a transmit mode of operation, and thus that the unwanted sideband detector 16 may be powered down in whole or in part. When the signal is unasserted, it indicates that the system is in the calibration mode of operation, and that the unwanted sideband detector should remain fully activated. Responsive to assertion of this signal, then, unwanted sideband detector 16 powers down or is rendered inactive, in whole or in part.

Figure 2F:
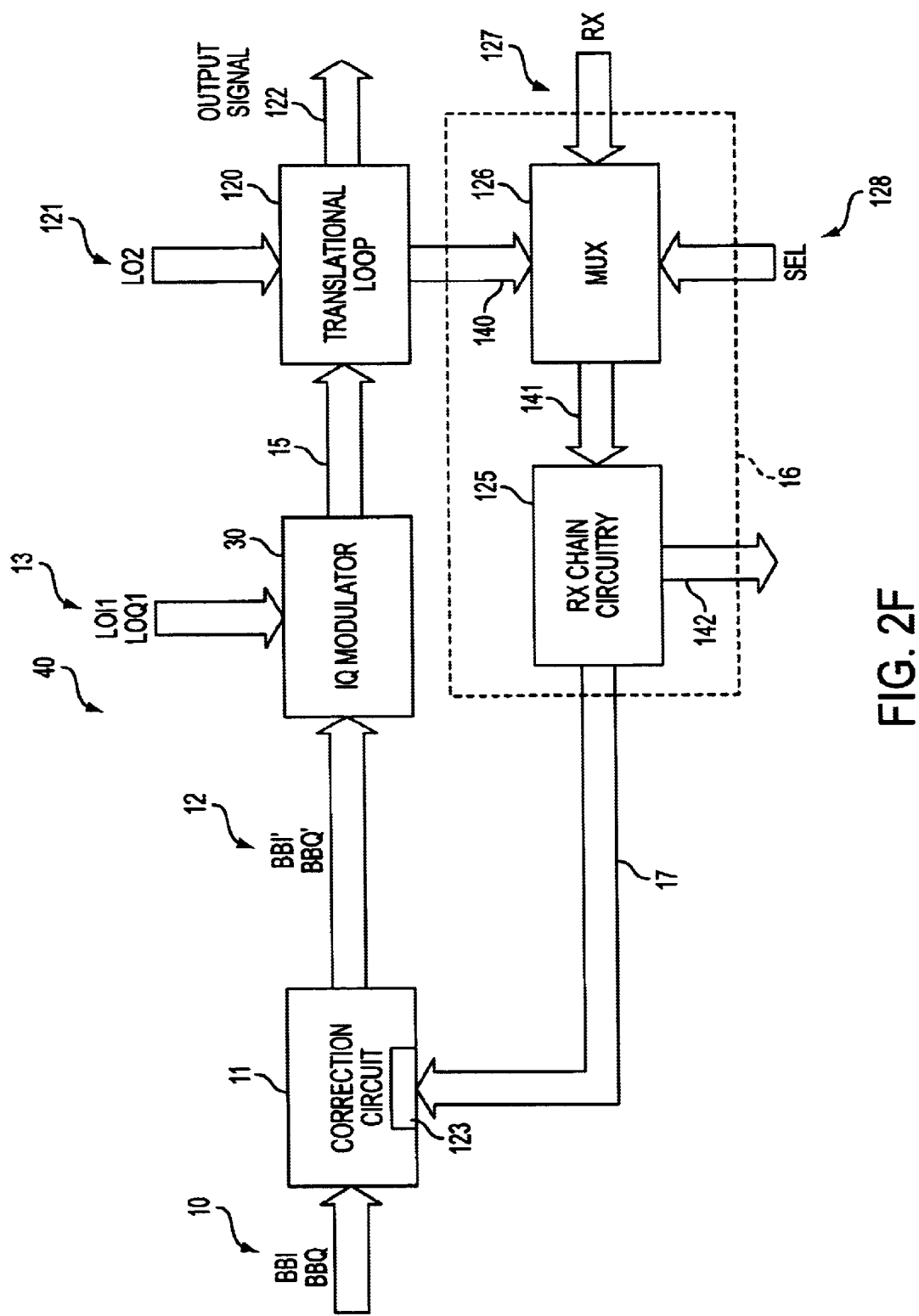
FIG. 2F illustrates a fourth embodiment of a system in accordance with the subject invention.

A fourth embodiment of the invention is illustrated in FIG. 2F. In this embodiment, the unwanted sideband detector 16 is formed, in whole or in part, from components of the receive chain of a transceiver of which the system 40 is a part. In effect, these components are shared between the unwanted sideband detector 16 and the receiver portion of the transceiver in which the system 40 is a part. The only additional components that may be required to form the detector in this case are relatively simple components, such as a buffer and low frequency amplifier.

A multiplexor 126 multiplexes between the signal 140 from translational loop 120, and the signal 127 (representing a transmitted signal received by the transceiver), responsive to a selection signal SEL, identified with numeral 128.

In one implementation, when the selection signal SEL is asserted, signal 140 is selected, and when the selection signal SEL is not asserted, the received signal 127 is selected. The multiplexed signal, identified with numeral 141, is then input to RX chain circuitry 125. RX chain circuitry 125 includes, at least in part, some of the circuitry in the receive chain of the transceiver of which the system 40 is a part.

The RX chain circuitry 125 has two outputs, identified respectively with numerals 17 and 142. Output 17 is operative in the case in which signal 140 is selected by the multiplexor 126, while output 142 is operative in the case in which signal 127 is selected by the multiplexor 126.

In a calibration mode of operation, the selection signal SEL is such that the signal 140 is selected by the mutliplexor and input to the RX chain circuitry 125. RX chain circuitry is configured to detect, in the manner previously described, any unwanted sideband in the output 122 of the translational loop, and to provide to the correction circuit 11 the output signal 17 representative of the unwanted sideband.

In other modes of operation, such as a receive mode of operation, in which a transceiver including the system 40 is receiving a transmitted signal, the signal SEL is set such that the receive signal 127 is selected by the multiplexor 126 and input to the RX chain circuitry 125. RX chain circuitry 125 operates on this signal to provide output signal 142 which is processed by the remaining components in the receive portion of the transceiver.

In the foregoing embodiment, it can be seen that the role played by the RX chain circuitry 125 depends on the state of the selection signal SEL. When the signal is in a first state, this circuitry functions to perform the task of detecting the unwanted sideband in the output 122 of the translational loop 120. However, when the signal is in a second state, this circuitry functions to perform the task of processing a transmitted signal received by the receiver.

Figure 2G:
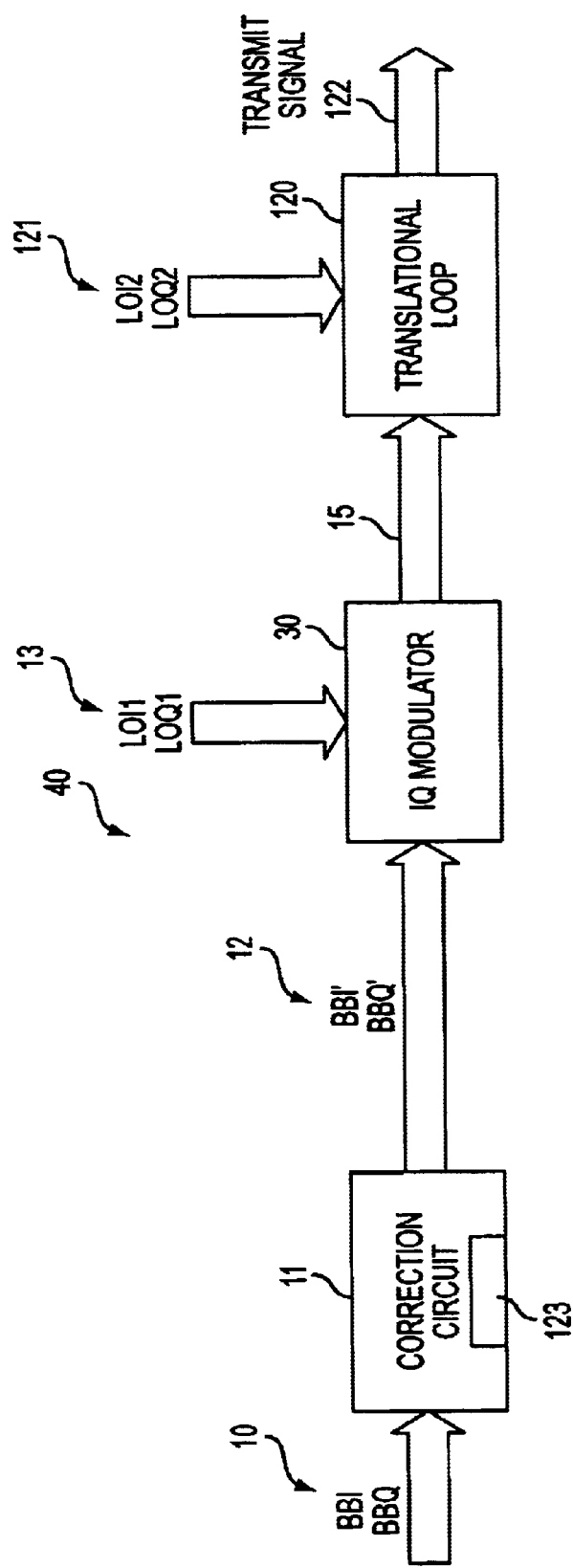
FIG. 2G illustrates a fifth embodiment of a system in accordance with the subject invention.

A fifth embodiment of the invention is illustrated in FIG. 2G. In this embodiment, a pre-determined value is stored in the memory 23 within the correction circuit 11. This value may be computed in a previous calibration mode by the system 40 illustrated in FIG. 2G, or it may be determined by means external to system 40. This value is used by correction circuit 11 to correct the complex baseband signal 10. The corrected baseband signal 12 is then upconverted to the desired transmit frequency by quadrature modulator 30 in combination with translational loop 120.

Figure 4:
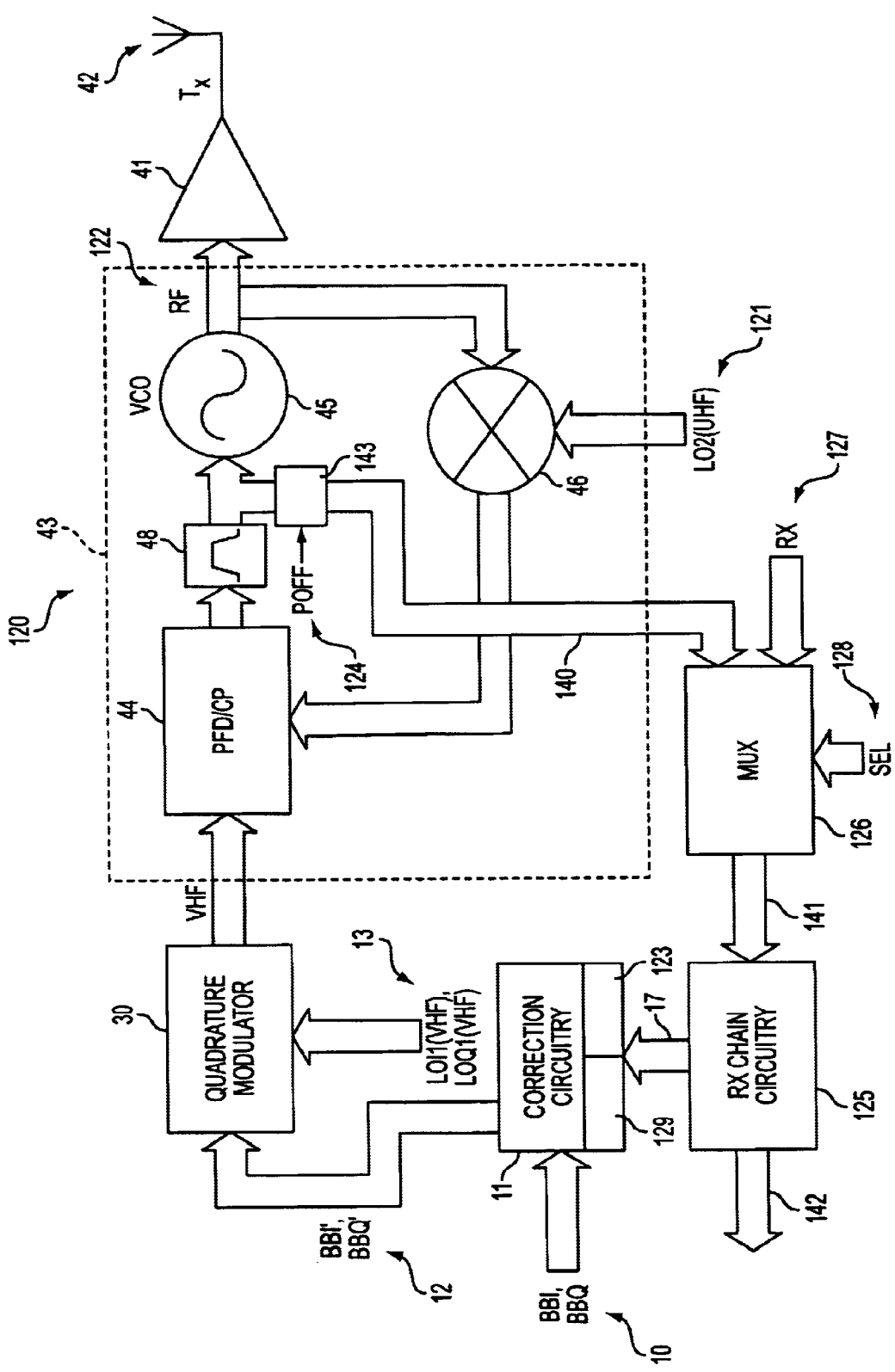
FIG. 4 illustrates an implementation of a system in accordance with the subject invention.

An implementation example of a system 120 in accordance with the subject invention is illustrated in FIG. 4. In this figure, compared to FIGS. 2A, 2D–2G, like elements are referenced with like identifying numerals.

In this implementation example, two modes of operation are supported: a transmit mode of operation and a calibration mode of operation.

In the transmit mode of operation, memory 123 in correction circuitry 11 contains a value which has been previously determined in the calibration mode of operation in order to reduce or eliminate the unwanted sideband in the output of translation loop 43.

A processor 129 within the correction circuitry 11 retrieves the pre-determined value from the memory 123, and uses the same to correct the complex baseband signal 10. The corrected baseband signal 12 is then upconverted to the desired transmit frequency by quadrature modulator 30 in combination with translation loop 43. This process occurs in two steps. In the first step, the corrected baseband signal 12 is upconverted to VHF frequencies by quadrature modulator 30 using a complex local oscillator signal 13 at VHF frequencies. In the second step, the output signal from the quadrature modulator is upconverted to the desired transmit frequency by translation loop 43 using a second oscillator signal 121 at UHF frequencies.

The output from the translation loop, signal 122, is then amplified by power amplifier 41, and the amplified signal transmitted over antenna 42.

Translation loop 43 comprises phase detector/charge pump 44, loop filter 48, VCO 45, and downconversion mixer 46. In addition, one or more additional filters (not ahown) may be included before or in the loop to perform various functions.

The output of downconversion mixer 46 is provided as an input to phase detector/charge pump 44. The other input to phase detector/charge pump 44 is the output of quadrature modulator 30. A clipper (not shown) may also be included between the output of the quadrature modulator 30 and the other input to phase detector/charge pump 44. The purpose is to eliminate any AM component of the output of the quadrature modulator 30. The presence of the AM component of the quadrature modulator indicates, as detailed in related co-pending application Ser. No. 09/515,633, the presence of unwanted sideband in the output of the quadrature modulator 30. In addition, a filter (not shown) may be included between the output of quadrature modulator 30 and phase detector/charge pump 44 in order to suppress the third harmonic of the transmission intermediate frequency.

Phase detector/charge pump 44 compares the phase of the signals provided at its two inputs, and outputs a signal having a magnitude proportional to the phase difference between the two input signals. The output of phase detector/charge pump 44 is filtered by loop filter 48, and then provided as an input to VCO 45.

The output of VCO 45 is input to the RF input of mixer 46. The frequency of the signal 121 applied to the LO input of mixer 46, $f_{UHF}$, is such that the sum of $f_{UHF}$ and $f_{VHF}$, the frequency of the signal 13 applied to the LO input of quadrature modulator 30, is equal to the desired transmit frequency.

The output of mixer will have two principal components, one at a relatively low frequency, and the other at a much higher frequency. A filter (not shown) may be included at the output of the mixer 46 in order to suppress the higher frequency component. The remaining component is provided as an input to phase detector/charge pump 44.

Translation loop 43 functions to upconvert the frequency of the signal output from quadrature modulator 30 so that it is at the selected transmit channel frequency. The loop functions as follows. The output of VCO 45 is provided to mixer 46. Phase detector/charge pump 44 adjusts its output until the phase of the signals at its two inputs are about the same. The effect of this is to adjust the frequency of the output of VCO 45 until this phase relationship is present. This will occur when the frequency at the output of the VCO 45 is equal to $f_{VHV}+f_{UHF}$, the desired transmit frequency.

The unwanted sideband detector 16 in this implementation example comprises buffer 143, multiplexor 126, and RX chain circuitry 125.

The buffer 143 is coupled to the input of VCO 45. The buffer 143 is responsive to a signal POFF, identified with numeral 124. In the transmit mode of operation, POFF is asserted such that buffer 143 isolates the input to the VCO 45 from signal line 140. In the calibration mode of operation, the signal POFF is not asserted. Responsive thereto, the buffer 143 couples the input of VCO 45 to signal line 140.

Multiplexor 126 and RX chain circuitry 125 function as previously described in relation to the embodiment illustrated in FIG. 2F. Briefly, in the transmit mode of operation, the RX chain circuitry 125 forms part of the receiver portion of a transceiver containing system 120. Thus, in this mode, received signal 127 is routed by multiplexor 126 through RX chain circuitry 125, and output 142 thereof, which is coupled to additional receiver circuitry, is operative. However, in the calibration mode of operation, this circuitry performs the function of detecting an unwanted sideband in the output 122 of translation loop 43. Accordingly, in this mode, multiplexor 126 routes signal 140 to RX chain circuitry 125, and output 17 from this circuitry is operative.

As can be seen, in the calibration mode of operation, the presence of an unwanted sideband is detected from the relatively low frequency signal 140 which is taken from the input of VCO 45. In this mode of operation, a known baseband signal, i.e., one having a defined frequency $f_{BB}$ is input to the correction circuitry 11. Processor 129 within correction circuitry 11 delays either the I or Q component of the baseband signal by a known amount $\phi$, which is then stored in the memory 123. The corrected baseband signal is then modulated by quadrature modulator 30, and the modulated signal input to translational loop 43.

Any unwanted sideband in the output of the quadrature modulator will, as previously described, show up in the output 122 of translational loop 43. Within translational loop 43, a low frequency signal will be generated at the input to VCO 45. The unwanted sideband will also show up in the input to the VCO 45 as a spike offset from DC by $f_m=2\times f_{BB}$, where $f_{BB}$ is the frequency of the known baseband signal input to the correction circuitry 11. The unwanted sideband detection circuitry 16 is configured to detect the energy in the signal at the input to the VCO at the frequency $f_m$ to provide a direct measure of the energy of the unwanted sideband in the output of the translational loop 43.

This implementation example exploits the following VCO input/output relationship:

$$\frac{E_{unwanted}}{E_{wanted}} = K_{vco} \times \frac{A_m}{2 \times f_m}$$

where $E_{unwanted}$=energy of the unwanted sideband at the output of the VCO (and thus at the output of the translational loop)

$E_{wanted}$=energy at the wanted sideband at the output of the VCO (and thus at the output of the translational loop).

$K_{vco}$=gain of the VCO (Hertz/V).

$A_m$=energy of the unwanted sideband at the input of the VCO.

$f_m$=frequency offset between the unwanted and wanted sidebands (and thus the frequency offset between the unwanted sideband and DC at the input of the VCO).

In accordance with this property, a simple measurement of the low frequency, i.e., baseband, signal at the input of the VCO is easily related to energy of the unwanted sideband in the output of the translational loop. For example, if the governing standard imposes the requirement that the energy of the unwanted sideband should be X dB or more less that the energy of the wanted sideband in the output of the translational loop, then that imposes the following requirement on the system:

$$20\log\left(K_{VCO} \times \frac{A_m}{2 \times f_m}\right) \leq -X$$

The purpose of the calibration mode is to lower $A_m$ sufficiently so that the foregoing relationship holds.

Figure 5:
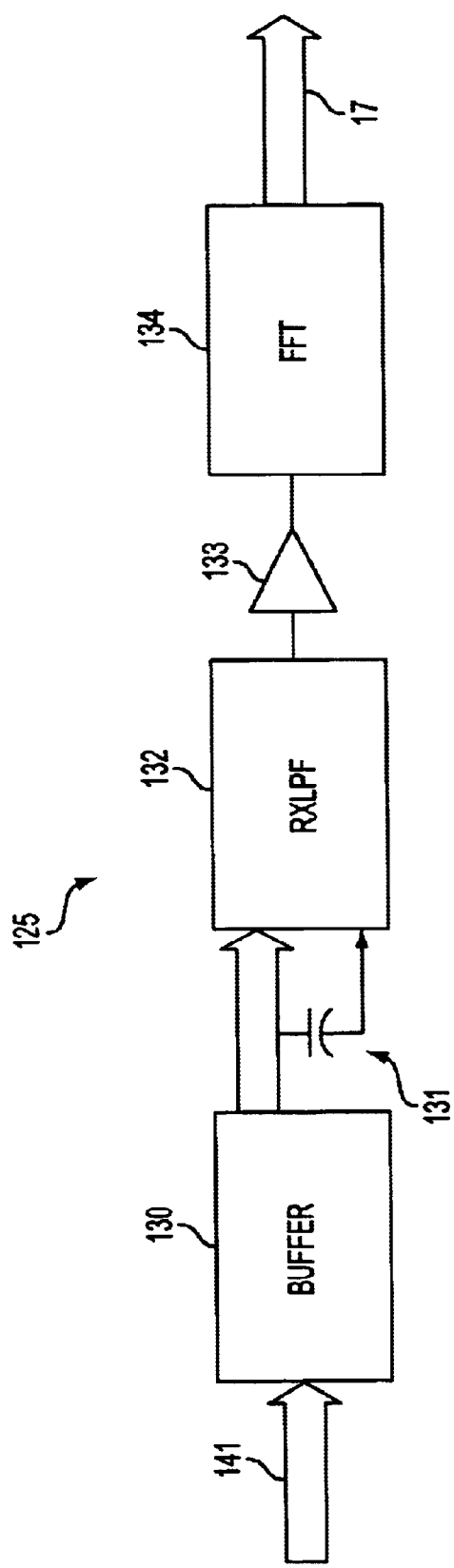
FIG. 5 illustrates a detailed example of the RX chain circuitry of the system of FIG. 4.

A specific configuration of the RX chain circuitry 125 is illustrated in FIG. 5. As illustrated, in this configuration, the circuitry 125 comprises buffer 130, sampling capacitor 131, RX low pass filter (LPF) 132, amplifier 133, and fast Fourier transform (FFT) circuitry 134.

The signal 141 is input to the buffer 130. The output of the buffer 130 drives one input of the RX LPF and sampling capacitor 131. The sampling capacitor 131 stores the DC value of the signal output from buffer 130, and buffers it to provide the second input to the RX LPF 132.

The output of the RX LPF 132 is amplified by amplifier 133. FFT 134 receives the output of the amplifier 133, and detects the power thereof at a specific frequency, such as $f_m$. A signal representative thereof is output on signal line 17.

In one example, in the calibration mode of operation, a known baseband signal at 67 kHz is used to calibrate the system. Since $f_{BB}$ is 67 kHz, $f_m$ is 134 kHz. In this example, in accordance with GSM standards, the energy of the unwanted sideband in the output of the translational loop should be 43 dB or more less than the energy of the wanted sideband. In the calibration mode of operation, the relative phase $\phi$ between the components of the baseband signal is iteratively adjusted until $A_m$ is such that $$20\log\left(K_{VCO} \times \frac{A_m}{2 \times f_m}\right) \leq -43.$$

When this relationship is achieved, both at the frequency of $f_m$=134 kHz, and also $f_m$=67 kHz (in order to stop LO feedthrough), the value of $\phi$ is stored for later use in the transmit mode of operation.

In this example, the RX LPF 132 and amplifier 133 are set to a 12 dB gain, and the sampling capacitor is 12 pF. FFT 134 is configured to detect power at both 134 kHZ and 67 kHz.

Figure 3A:
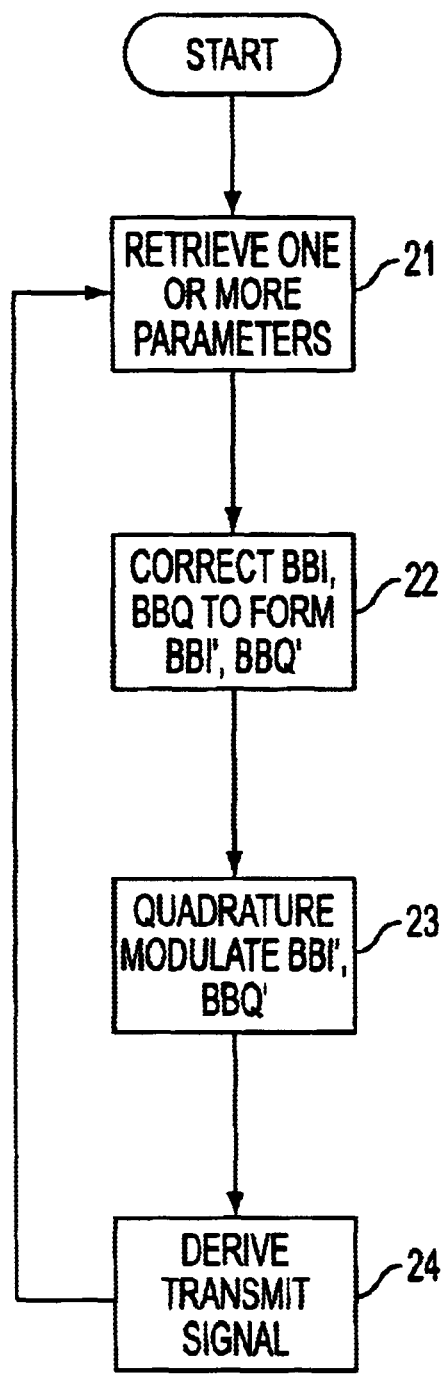
FIG. 3A illustrates an embodiment of a method of transmitting in accordance with the subject invention.

In one embodiment, a method of forming a transmit signal in accordance with the subject invention is illustrated in FIG. 3A. As shown, this embodiment of the method comprises, retrieving, in step 21, one or more parameters predetermined to reduce or eliminate an unwanted sideband in the transmit signal; correcting, in step 22, one or more of BBI and BBQ responsive to the one or more parameters, thereby forming BBI' and BBQ'; quadrature modulating, in step 23, BBI' and BBQ' respectively with the I and Q components of a local oscillator, LOI and LOQ, to form a modulated signal; deriving, in step 24, the transmit signal from the modulated signal; and then looping back to step 21, whereupon the foregoing process may repeat itself one or more times. In one implementation, the deriving step comprises upconverting the modulated signal to form the transmit signal.

Figure 3B:
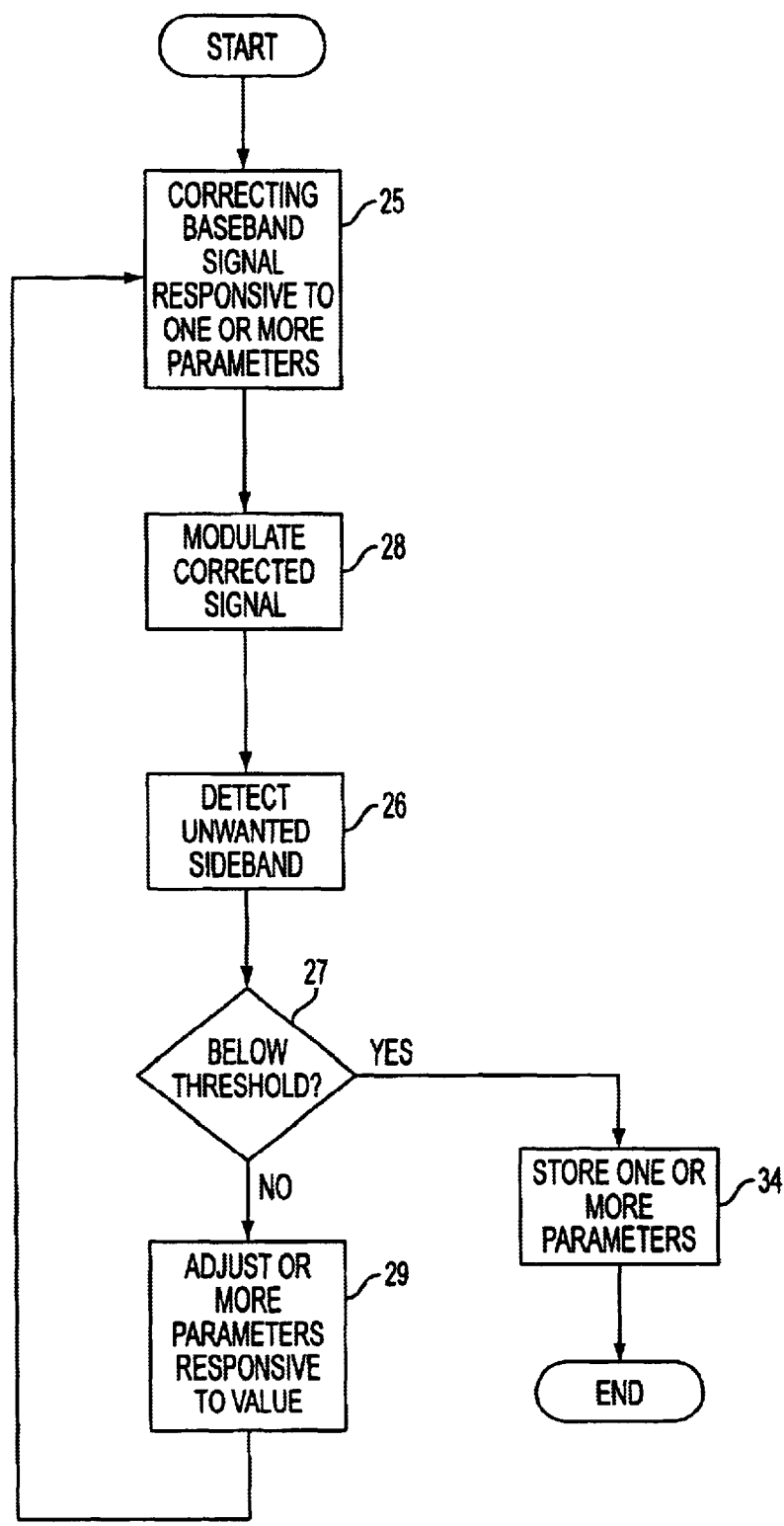
FIG. 3B illustrates an embodiment of a method of calibrating a transmitter in accordance with the subject invention.

In one embodiment, a method of calibrating a transmitter is illustrated in FIG. 3B. As shown, in this embodiment, the method comprises correcting, in step 25, a baseband signal using one or more parameters; modulating, in step 28, the corrected baseband signal; detecting, in step 26, an unwanted sideband component in a signal derived from the modulated signal; determining, in decision block 27, whether the unwanted sideband is below a desired threshold level and if so, storing, in step 34, the one or more parameters, and then ending the process; if not, in step 29, adjusting or revising the one or more parameters responsive to the detected unwanted sideband component; and then returning to step 25, whereupon the foregoing steps may be repeated one or more times until the unwanted sideband component is reduced to an acceptable level.

In one implementation, the modulated signal is upconverted to a desired transmission frequency, and the detecting step comprises detecting the unwanted sideband from a low frequency signal generated within the translational loop. In one implementation example, the low frequency signal is generated at the input of a VCO within the translational loop.

One advantage of the invention is the ability to correct for any inaccuracies in the components of the quadrature modulator.

Another advantage is the ability to correct for any inaccuracies in the quadrature of the I and Q components of the baseband signal.

A third advantage is that a highly accurate phase detector is not required.

A fourth advantage is that correction to a high frequency signal is not required. Instead, the invention only requires correction to the relatively low frequency baseband signal.

A fifth advantage is detection of unwanted sideband from a high frequency signal is not required. Instead, any unwanted sideband component is detected from a low frequency signal generated within the translation loop of the transmitter.

Additional advantages of the subject invention will be set forth in the description which follows, or will be apparent to one of skill in the art.

While embodiments, implementations, and implementation examples of the subject invention have been shown and described, it should be appreciated that there are many more embodiments, implementations, and implementation examples that are within the scope of the subject invention. Accordingly, the scope of the invention is not to be restricted, except in light of the appended claims and their equivalents.

What is claimed is:

1. A system for reducing or eliminating any unwanted sideband component in the output of a transmitter, the system comprising:

a correction circuit for receiving a baseband signal, and correcting the baseband signal responsive to one or more parameters to provide a corrected baseband signal;

a quadrature modulator for receiving the corrected baseband signal and quadrature modulating the same using a first local oscillator signal to provide an output;

a translational loop for upconverting the output of the quadrature modulator to form an output at a desired transmit frequency using a second local oscillator signal; and an unwanted sideband detector for detecting an unwanted sideband in the output of the translational loop responsive to a signal provided by the translational loop;

wherein the correction circuit is also configured to set or alter the one or more parameters responsive to the detected unwanted sideband.

2. The system of claim 1 wherein the one or more parameters are stored in a memory in the correction circuit.

3. The system of claim 1 wherein the unwanted sideband detector is powered down in a transmit mode of operation.

4. The system of claim 2 wherein the one or more parameters are determined in a calibration mode of operation.

5. The system of claim 1 wherein the signal provided by the translational loop is an input to a VCO within the translational loop.

6. The system of claim 5 wherein the input to the VCO is a low frequency signal.

7. The system of claim 6 wherein the unwanted sideband detector is configured to derive a value $$K_{VCO} \times \frac{A_m}{2 \times f_m},$$

wherein $K_{VCO}$ is the gain of the VCO, $A_m$ is the energy at the input of the VCO at the frequency $f_m$, and $f_m$ is the frequency offset between the unwanted and wanted sidebands.

8. The system of claim 7 wherein the one or more parameters are iteratively adjusted until the value is at or below a desired threshold level.

9. The system of claim 8 wherein the baseband signal is a quadrature signal having I and Q components in a relative phase relationship, and the one or more parameters are used to set or adjust the relative phase between the I and Q components.

10. The system of claim 9 wherein the correction circuit is configured to iteratively adjust the relative phase relationship of the I and Q components of the baseband signal until they are about in quadrature.

11. An RF transmitter including the system of claim 10.

12. A method of calibrating a transmitter comprising the steps of:

correcting a baseband signal responsive to one or more parameters to form a corrected baseband signal;

modulating the corrected baseband signal to form a modulated signal;

upconverting the modulated signal to form a transmit signal;

detecting an unwanted sideband in the transmit signal;

if the unwanted sideband is below a desired threshold, storing the one or more parameters, and ending the method; and if the unwanted sideband is not below a desired threshold, revising the one or more parameters responsive to the detected unwanted sideband, and jumping to the correcting step.

13. The method of claim 12 wherein the baseband signal has I and Q components in a relative phase relationship, and the correcting step comprises adjusting the relative phase relationship of the I and Q components.

14. The method of claim 12 wherein the upconverting step is performed by a translational loop, and the detecting step comprises detecting the unwanted sideband from a low frequency signal generated within the translational loop.

15. The method of claim 14 further comprising generating the low frequency signal from an input of a VCO within the translational loop.

16. The method of claim 15 further comprising forming the value $$K_{VCO} \times \frac{A_m}{2 \times f_m},$$

wherein $K_{VCO}$ is the gain of the VCO, $A_m$ is the energy of the input to the VCO at the frequency $f_m$, and $f_m$ is the frequency offset between the unwanted and wanted sidebands.

* * * * *